(12) United States Patent
Ogawa

(10) Patent No.: US 6,778,015 B2
(45) Date of Patent: Aug. 17, 2004

(54) DISTRIBUTED AMPLIFIER

(75) Inventor: Yasunori Ogawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/259,893

(22) Filed: Sep. 30, 2002

(65) Prior Publication Data

US 2003/0184383 A1 Oct. 2, 2003

(30) Foreign Application Priority Data

Mar. 29, 2002 (JP) ........................................ 2002-094316

(51) Int. Cl.[7] .............................................. H03F 3/60
(52) U.S. Cl. ........................ 330/286; 330/54; 330/295
(58) Field of Search ................................ 330/286, 295, 330/84, 54, 98

(56) References Cited

U.S. PATENT DOCUMENTS

| | | | | |
|---|---|---|---|---|
| 6,049,250 A | * | 4/2000 | Kintis et al. | ................... 330/54 |
| 6,400,226 B2 | * | 6/2002 | Sato | ........................... 330/286 |
| 6,433,640 B1 | * | 8/2002 | Pavio et al. | ................ 330/295 |
| 6,472,941 B2 | * | 10/2002 | Shigematsu | ................ 330/286 |

OTHER PUBLICATIONS

"A 69GHz Brooadband Distributed Amplifier", Y. Ogawa et al., 2001 Electronics Society Conference of the Electronic Information and Communications Society (Denshi Joho Tsushin Gakkai), p. 53 (disclosed on page 1 of the specification).

* cited by examiner

*Primary Examiner*—Henry Choe
(74) *Attorney, Agent, or Firm*—Wenderoth, Lind & Ponack, L.L.P.

(57) ABSTRACT

A distributed amplifier having a plurality of cascode amplifying circuits, and which causes little deterioration of the output waveform. In a preferred embodiment, the source potentials of the source-grounded transistors of the respective amplifying circuits are set individually. The source potentials of none or one or more of the source-grounded transistors are set at +0.8 volts, and the source potentials of the remaining source-grounded transistors are set at zero volts. The voltage gain of the source-grounded transistors whose source potential is +0.8 volts is zero, so that these source-grounded transistors do not contribute to the voltage gain of the amplifier as a whole. The source-grounded transistors whose source potential is zero volts contribute to the voltage gain, and output an amplified signal with a good waveform. The magnitude of the voltage gain can be adjusted by setting the number of source-grounded transistors whose source potential is zero volts.

17 Claims, 9 Drawing Sheets

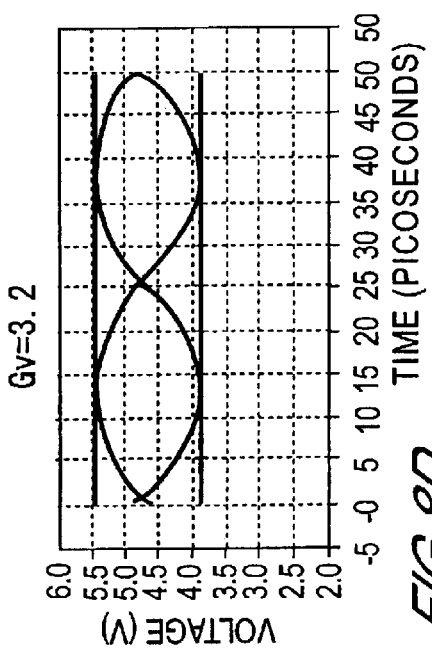
FIG.8A INPUT WAVEFORM
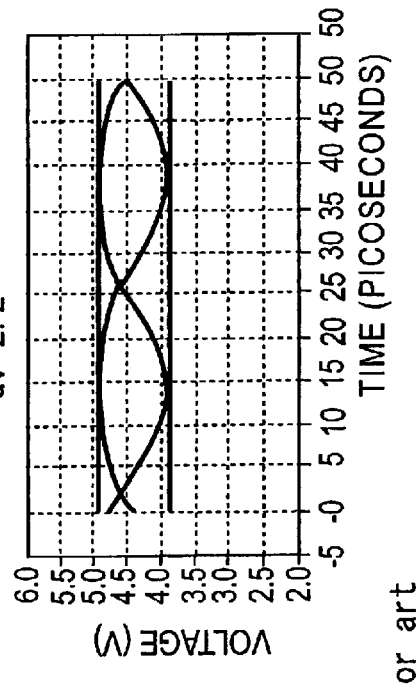
FIG.8C Gv=3.2
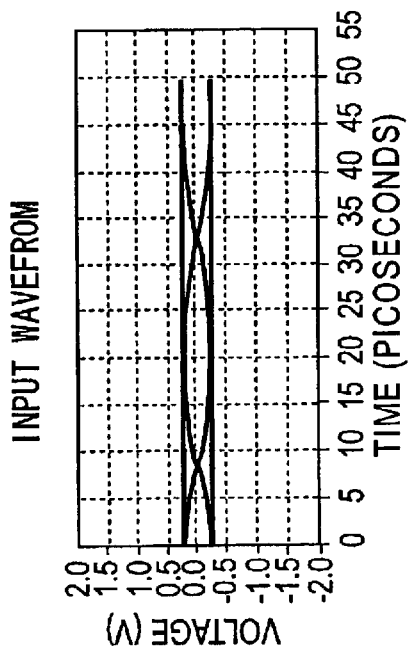
FIG.8B Gv=3.4
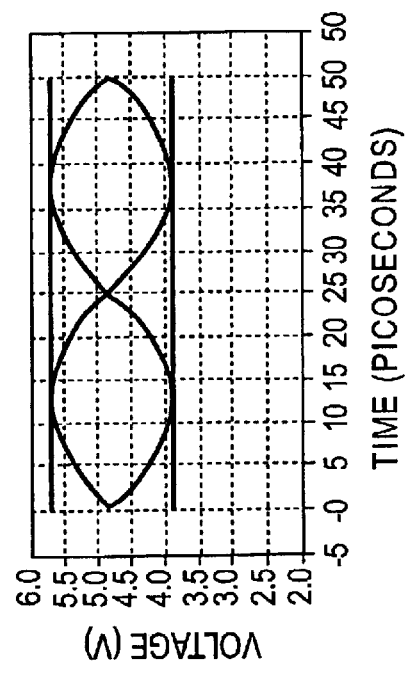
FIG.8D Gv=2.2
prior art

DISTRIBUTED AMPLIFIER

BACKGROUND OF THE INVENTION

1. Field of the Invention

The present invention relates to a distributed amplifier. For example, the distributed amplifier of the present invention is applied to broadband voltage amplifiers used in optical communications systems or the like.

2. Description of Related Art

Conventionally, distributed amplifiers have been known as amplifiers that amplify broadband signals. For example, the "A 69 GHz broadband Distributed Amplifier" described on page 53 of Preprints of the 2001 Electronics Society Conference of the Electronic Information and Communications Society [Denshi Joho Tsushin Gakkai] (Ogawa et al.) is known as a distributed amplifier.

FIG. 7 is a circuit diagram which shows the construction of such a distributed amplifier. The distributed amplifier 700 comprises source-grounded field effect transistors 701-1 through 701-8 and gate-grounded field effect transistors 702-1 through 702-8. The drains of the source-grounded transistors 701-1 through 701-8 are respectively connected to the sources of the corresponding gate-grounded transistors 702-1 through 702-8. Amplifying circuits that combine source-grounded amplifying transistors and gate-grounded amplifying transistors are called "cascode amplifying circuits". In the example shown in FIG. 7, eight cascode amplifying circuits are provided. Specifically, this distributed amplifier 700 has an eight-section construction.

The sources of the source-grounded transistors 701-1 through 701-8 are connected in common to a ground line. Furthermore, the gates of the gate-grounded transistors 702-1 through 702-8 are connected in common to a VC power supply.

The gates of the gate-grounded transistors 701-1 through 701-8 are connected to a signal input terminal 711. A signal IN is input from the signal input terminal 711.

The drains of the gate-grounded transistors 702-1 through 702-8 are connected to a signal output terminal 712. A signal OUT is output from the signal output terminal 712. A power supply potential VDD is applied to this signal output terminal 712 by means of an external bias circuit not shown in the figures.

Coplanar transmission lines 703-1 through 703-8, 704-1 through 704-8, 705-1 through 705-8 and 706-1 through 706-8 are used as transmission paths that are connected between the source-grounded transistors 701-1 through 701-8 and the gate-grounded transistors 702-1 through 702-8.

The transmission line consisting of the coplanar transmission lines 703-1 through 703-8 is connected to a ground line via a terminating resistance 707 and a capacitor 708. A bias input terminal 713 is connected between the terminating resistance 707 and capacitor 708. The bias input terminal 713 is used for the external connection of another capacitor in cases where the capacitance of the capacitor 708 in insufficiently large; furthermore, this bias input terminal 713 is also used to supply the gate bias TMI of the source-grounded transistors 701-1 through 701-8. Here, when the gate bias TMI is supplied, an external circuit (not shown in the figures) must be connected to the bias input terminal 713 in order to cut the direct-current component.

The transmission line consisting of the coplanar transmission lines 706-1 through 706-8 is connected to a ground line via a terminating resistance 709 and a capacitor 710. A terminal 714 is connected between the terminating resistance 709 and the capacitor 710. This terminal is used for the external connection of another capacitor in cases where the capacitance of the capacitor 710 in insufficiently large. Here, a terminating resistance (not shown in the figures) is externally connected to the signal output terminal 712. Specifically, in this distributed amplifier 700, two output side terminating resistances are used. These output side terminating resistances are connected in parallel as seen from the side of the gate-grounded transistors 702-1 through 702-8.

The circuit thus constructed can be caused to function as a broadband amplifier by appropriately setting the potentials VDD, VC and TMI. The voltage gain Gv of this distributed amplifier is given by Equation (1) below. In Equation (1), n is the section number, and gm is the mutual conductance per section. Furthermore, RL/2 is the synthesized value of the two output side terminating resistances.

$$Gv = n \times gm \times RL/2 \qquad (1)$$

Ordinarily, the voltage gain Gv of the distributed amplifier is set by varying the potential TMI, i.e., the gate bias of the source-grounded transistors 701-1 through 701-8. Varying the potential TMI causes that voltages across the gates and sources of the respective source-grounded transistors 701-1 through 701-8 to vary; as a result, the mutual conductance gm varies, so that the voltage gain Gv can be varied. In cases where the potential TMI is used, the voltage gain Gv can be continuously varied from zero to the maximum value Gvmax.

However, the distributed amplifier shown in FIG. 7 suffers from the following drawback: specifically, when the potential TMI is varied in order to reduce the voltage gain Gv, there is also a variation in the output signal waveform. Such waveform variation is usually a problem for the device that receives such an output signal. The effect of this drawback is especially conspicuous in the case of distributed amplifiers used to amplify base-band digital signals used in optical communications devices and the like.

FIGS. 8A–8D show simulated results for the input waveform and output waveform of the distributed amplifier 700. In this simulation, GaAs Pseudomorphic HEMTs (high electron mobility transistors) with a gate length of 0.1 m and a gate width of 40 m were used as the respective transistors 701-1 through 701-8 and 702-1 through 702-8.

FIG. 8A shows the waveform of the input signal IN (see FIG. 7). The input signal IN is a 40 Gbps seven-stage quasi-random signal with an amplitude of 0.5 volts (i.e., 0.5 Vpp). A waveform of the type shown in FIG. 8A is called an eye pattern. When a waveform is evaluated using an eye pattern, the position of the cross point between the rising portion and falling portion of the signal is an important parameter. Specifically, it may be said that the deterioration of the signal waveform becomes more severe as the positional deviation of the cross point increases. In most cases, as is shown in FIG. 8A the cross point of the input signal IN is set so that this cross point is positioned substantial center between the high level and the low level.

FIG. 8B shows the waveform of the output signal OUT that was obtained when the potential TMI was set at zero volts. The voltage gain Gv in this case was 3.4. As is seen from FIG. 8B, the position of the cross point of the output signal OUT, like that of the cross point of the input signal IN (see FIG. 8A) is more or less the center between the high level and low level.

FIG. 8C shows the waveform of the output signal OUT that was obtained when the potential TMI was set at −0.25 volts. The voltage gain Gv in this case was 3.2. As is seen from FIG. 8C, the position of the cross point of the output signal OUT is slightly higher than the positions of the cross point in the waveforms shown in FIGS. 8(A) and 8(B).

FIG. 8D shows the waveform of the output signal OUT that was obtained when the potential TMI was set at −0.50 volts. The voltage gain Gv in this case was 2.2. As is seen from FIG. 8D, the position of the cross point of the output signal OUT is more higher than the position of the cross point in the waveform shown in FIG. 8C.

The reasons for such deviation of the cross point will be described below with reference to FIG. 9. FIG. 9 is a graph which shows the relationship between the gate-source voltage Vgs and the mutual conductance gm in the source-grounded transistors 701-1 through 701-8. In FIG. 9, the operating points b, c and d correspond respectively to FIGS. 8B, 8C and 8D.

As is seen from the abovementioned Equation (1), the mutual conductance gm is proportional to the voltage gain Gv; accordingly, if the mutual conductance gm increases, the voltage gain Gv also increases. Furthermore, as is shown in FIG. 9, varying the gate-source voltage Vgs causes the mutual conductance gm to vary. Accordingly, the voltage gain Gv of the distributed amplifier can be varied by varying the gate-source voltage Vgs.

As was described above, variation in the waveforms becomes more severe in the order FIG. 8B→FIG. 8C→FIG. 8D. If this is applied to the operating points in FIG. 9, then the variation in the waveforms becomes more severe in the order b→c→d. It is seen from this that the variation in the waveforms becomes more severe as the operating point is positioned in a region where the slope of the gm curve is larger. In a case where the amplitude of the input signal IN is 0.5 Vpp as in the example shown in FIG. 8, the gate-source voltages Vgs of the source-grounded transistors 701-1 through 701-8 swing about the operating point in the range of ±0.25 Vpp. Accordingly, if the curve is inclined in the vicinity of the operating point, the mutual conductance gm fluctuates as the gate-source voltage Vgs swings; as a result, the voltage gain also fluctuates. For example, in the case of the operating pint d and operating point c in FIG. 9, the voltage gain Gv is reduced in the vicinity of the low level of the input signal IN, and the voltage gain is increased in the vicinity of the high level of the input signal IN. Here, in the distributed amplifier shown in FIG. 7, the output signal OUT is inverted with respect to the input signal IN. Accordingly, the output signal OUT has a small voltage gain Gv in the vicinity of the high level, and the voltage gain Gv is large in the vicinity of the low level of the input signal IN. Accordingly, in the case of the operating points d and c, an output signal OUT with a waveform in which the vicinity of the low level is emphasized is generated. As a result, it appears that distortion of the output signal OUT with respect to the input signal IN is generated, so that the cross point is shifted upward.

Meanwhile, in the case of the operating point b, the gm curve is more or less left-right symmetrical in the region of ±0.25 Vpp. Accordingly, the voltage gain Gv in the vicinity of the low level of the input signal IN and the voltage gain Gv in the vicinity of the high level of the input signal IN are more or less the same, so that there is almost no deviation of the cross point. Accordingly, a good output waveform can be obtained.

Depending on the application, there may be cases in which the position of the cross point is deliberately set as a position that is shifted from the vicinity of the center between the high level and the low level. The cross point is shifted from the set position in accordance with variations in the potential TMI. Accordingly, the output signal waveform becomes a waveform that differs from the intended waveform.

In the distributed amplifier shown in FIG. 7, as was described above, the voltage gain Gv can be controlled using the potential TMI; however, the variation in the waveform of the output signal OUT may become severe depending on the set value of the voltage gain Gv. This is an extremely serious problem in applications in which a good waveform is required.

SUMMARY OF THE INVENTION

It is an object of the present invention to provide a distributed amplifier in which there is little deterioration in the output waveform accompanying control of the voltage gain.

Accordingly, the distributed amplifier of the present invention comprises a plurality of amplifying circuits which input signal supplied from a common input terminal, and which supply the signals to a common output terminal following amplification, wherein the amplifier is constructed so that the gain values of the amplifying circuits are set separately for each amplifying circuit.

In the distributed amplifier of the present invention, the gain can be set separately for each amplifying circuit. The gain of the distributed amplifier is the composition value of the gains of all amplifying circuits. The distributed amplifier of the present invention can obtain a output signal of good waveform when each gain of amplifying circuit is set to a value which causes substantial no distortion of waveform.

BRIEF DESCRIPTION OF THE DRAWINGS

Other objects and advantages of the present invention will be described below with reference to the following attached figures:

FIGS. 8A, 8B, 8C and 8D are graphs which show the characteristics of the conventional distributed amplifier.

DESCRIPTION OF THE PREFERRED EMBODIMENTS

Embodiments of the present invention will be described below with reference to the attached figures. In the figures, the sizes, shapes and positional relationships of the respective constituent components are merely shown in schematic terms in order to facilitate the understanding of the present invention; furthermore, the numerical conditions described below are merely examples.

First Embodiment

A distributed amplifier constituting a first embodiment of the present invention will be described with reference to FIGS. 1 through 4.

Figure 7:
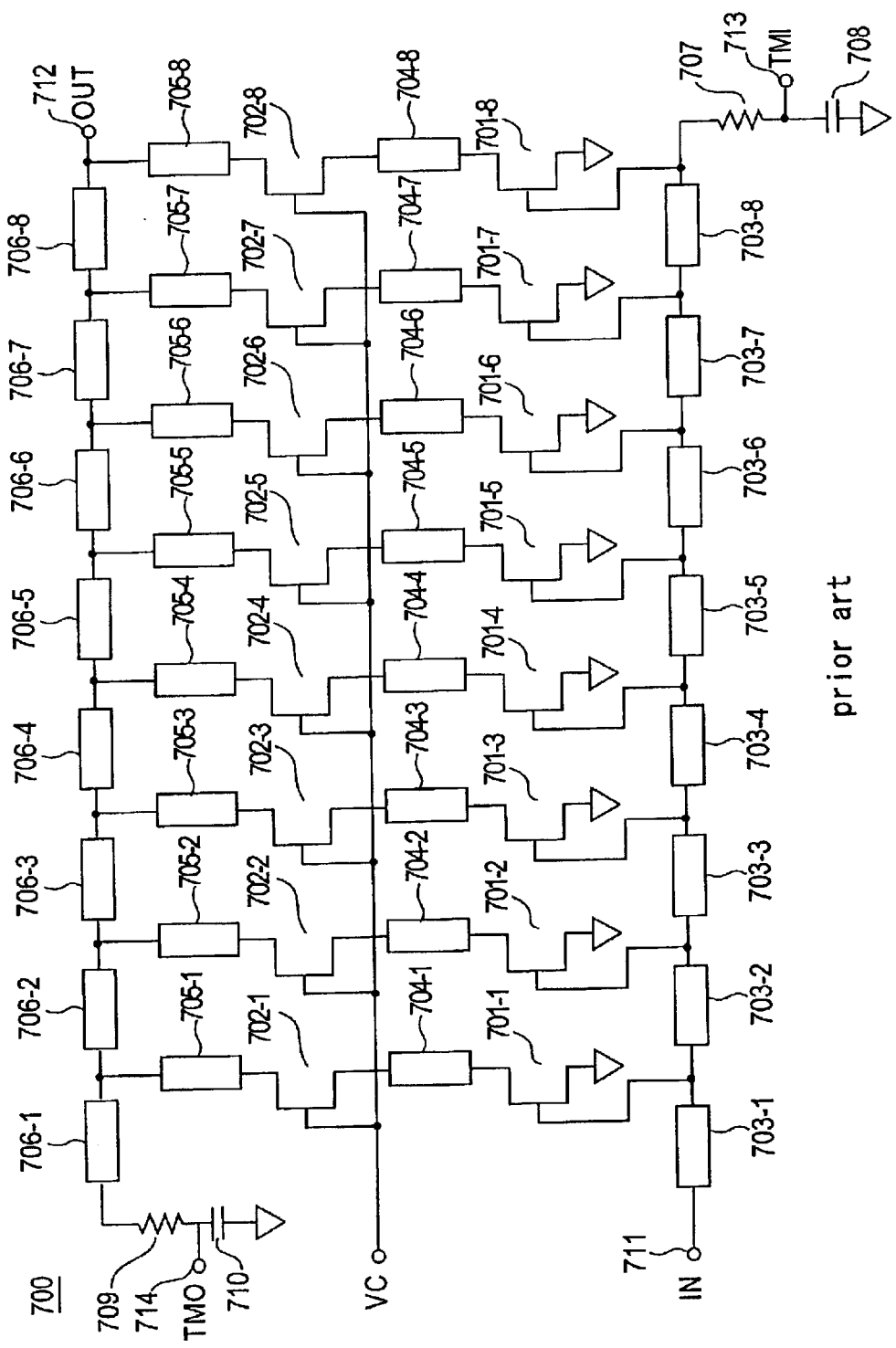
FIG. 7 is a circuit diagram which shows the construction of a conventional distributed amplifier.

The distributed amplifier of this embodiment differs from the conventional distributed amplifier 700 (see FIG. 7) in that the source potential of the source-grounded transistors is not common to all of the transistors.

Figure 1:
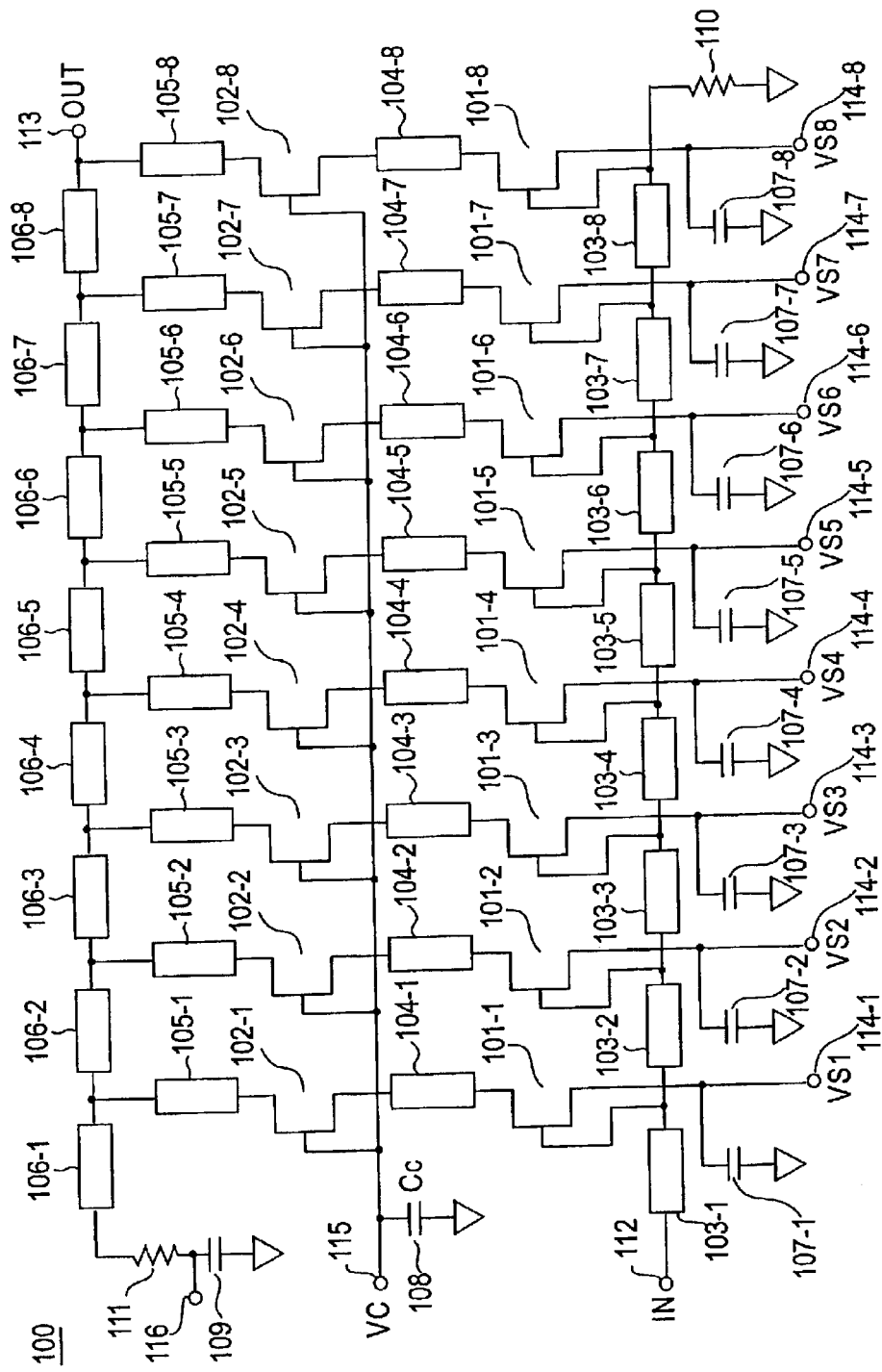
FIG. 1 is a circuit diagram which shows the construction of a distributed amplifier constituting a first embodiment of the present invention.

As is shown in FIG. 1, this distributed amplifier 100 comprises source-grounded field effect transistors 101-1 through 101-8, gate-grounded field effect transistors 102-1 through 102-8, coplanar transmission lines 103-1 through 103-8, 104-1 through 104-8, 105-1 through 105-8 and 106-1 through 106-8, capacitors 107-1 through 107-8, 108 and 109, resistances 110 and 111, a signal input terminal 112, a signal output terminal 113, source potential input terminals 114-1 through 114-8 and a gate bias input terminal 115.

Respective cascode amplifying circuits are constructed by corresponding pairs of the source-grounded transistors 101-1 through 101-8 and gate-grounded transistors 102-1 through 102-8. Accordingly, this distributed amplifier has an eight-section construction. However, the number of sections may be arbitrarily determined in accordance with the signal band, voltage gain Gv and the like.

GaAs Pseudomorphic HEMTs with a gate length of 0.1 and a gate width of 40 m were used as the source-grounded transistors 101-1 through 101-8. The characteristics of the respective source-grounded transistors 101-1 through 101-8 are the same as those of the conventional source-grounded transistors 701-1 through 701-8 (see FIG. 9). The gates of the source-grounded transistors 101-1 through 101-8 are respectively connected to the signal input terminal 112 via the coplanar transmission lines 103-1 through 103-8. Furthermore, the respective sources of the source-grounded transistors 101-1 through 101-8 are connected to the source potential input terminals 114-1 through 114-8. Moreover, the respective sources of the source-grounded transistors 101-1 through 101-8 are connected to a ground line via the capacitors 107-1 through 107-8 (described later).

As in the case of the source-grounded transistors 101-1 through 101-8, GaAs Pseudomorphic HEMTs with a gate length of 0.1 $\mu$m and a gate width of 40 $\mu$m were used as the gate-grounded transistors 102-1 through 102-8. The sources of the gate-grounded transistors 102-1 through 102-8 are connected to the drains of the source-ground transistors 101-1 through 101-8 via the coplanar transmission lines 104-1 through 104-8. Furthermore, the gates of the gate-grounded transistors 102-1 through 102-8 are connected in common to the gate bias input terminal 115. Moreover, the drains of the gate-grounded transistors 102-1 through 102-8 are connected to the signal output terminal 113 via the coplanar transmission lines 105-1 through 105-8 and 106-2 through 106-8.

Since coplanar transmission lines that are the same as conventional lines can be used as the coplanar transmission lines 103-1 through 103-8, 104-1 through 104-8, 105-1 through 105-8 and 106-1 through 106-8, a description is omitted here.

As was described above, the capacitors 107-1 through 107-8 are disposed between the sources of the source-grounded transistors 101-1 through 101-8 and the ground line. These capacitors 107-1 through 107-8 are installed in order to achieve stable grounding of the sources of the source-grounded transistors 101-1 through 101-8 over a broadband. Depending on the application, it may be necessary to use capacitors with a large electrostatic capacitance of approximately 0.1 $\mu$F as the capacitors 107-1 through 107-8. In cases where capacitors with such a large capacitance cannot be formed on the chip, it is sufficient (for example) to form capacitors with a capacitance of approximately 100 pF on the chip, and to connect capacitors with a capacitance of approximately 0.1 $\mu$F externally.

One end of the capacitor 108 is connected to the gate bias input terminal 115, and the other end is connected to the ground line. One end of the capacitor 109 is connected to the coplanar transmission line 106-1 via the resistance 111, and the other end is connected to the ground line. One end of the resistance 110 is connected to the coplanar transmission line 103-8, and the other end is connected to the ground line. The capacitor 108 is used in order to stabilize the gate bias of the gate-grounded transistors 102-1 through 102-8. The capacitor 109 is used to achieve alternating-current termination of the corresponding transmission line by cutting the direct-current component. The resistance 110 is a terminating resistance for the input signal IN. Furthermore, the resistance 111 is one terminating resistance for the output signal OUT. The other terminating resistance (not shown in the figures) is externally connected to the signal output terminal 113. In this embodiment, the values of the two terminating resistances are set at the same value RL (e.g., 50 ohms).

Next, the operation of the distributed amplifier 100 shown in FIG. 1 will be described.

A power supply potential VDD is applied to the signal output terminal 113 of the distributed amplifier 100 by means of an externally connected bias circuit (not shown in the figures). In this embodiment, the power supply potential VDD was set at 4 volts. Furthermore, a gate bias potential VC is applied to the gate bias input terminal 115. In this embodiment, the gate bias potential VC was set at 2 volts. Furthermore, potentials VS1 through VS8 are applied to the source potential input terminals 114-1 through 114-8 as the source potentials of the source-grounded transistors 101-1 through 101-8. In this embodiment, the potentials VS1 through VS8 were respectively set at either zero volts or +0.8 volts.

First, a case in which all of the source potentials VS1 through VS8 are set at zero volts will be considered. In this case, the circuit of the distributed amplifier 100 is equivalent to that of the conventional distributed amplifier 700 (see FIG. 7). In this case, furthermore, since the gate-source voltages of the respective source-grounded transistors 101-1 through 101-8 are zero volts, the operating point for these transistors 101-1 through 101-8 is point b in FIG. 9. Accordingly, as was described with reference to FIG. 9, a good output waveform with little variation can be obtained. The voltage gain Gv of the distributed amplifier 100 in this case is given by an equation in which "8" is substituted for n in the abovementioned Equation (1).

Figure 9:
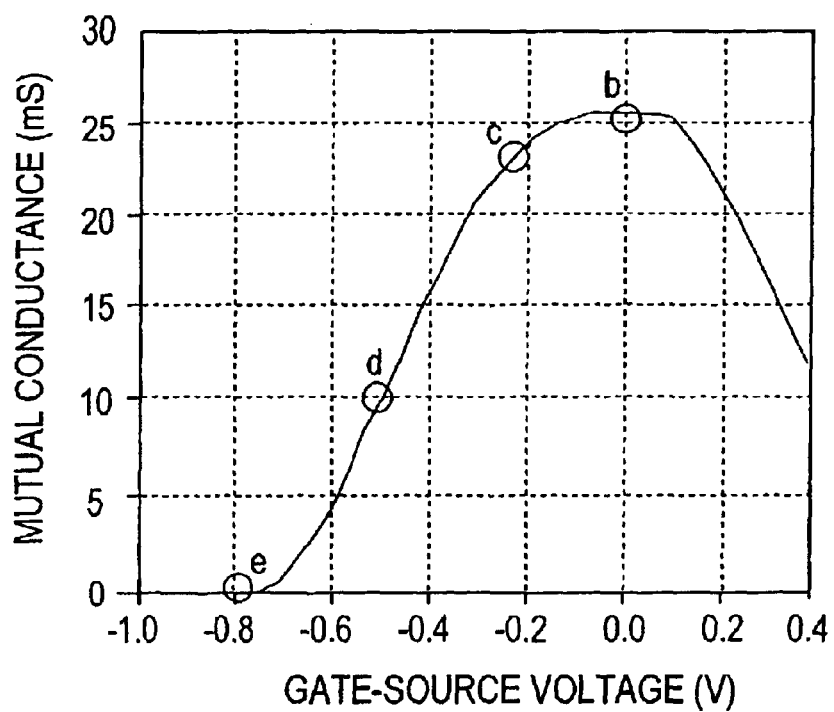
FIG. 9 is a graph which shows the characteristics of the conventional distributed amplifier.

Next, a case in which the source potential VS1 is set at +0.8 volts and the other source potentials VS2 through VS8 are set at zero volts will be described. In this case, the gate-source voltage of the source-grounded transistor 101-1 is −0.8 volts; accordingly, the operating point is point e in FIG. 9. Meanwhile, since the gate-source voltages of the other source-grounded transistors 101-2 through 101-8 are zero volts, the operating point is point b in FIG. 9. In a case where the operating point is point e, as is shown in FIG. 9, the source-grounded transistor is pinched off, so that the voltage gain is zero. Accordingly, the distributed amplifier 100 functions as a distributed amplifier in which the number of sections is 7. The voltage gain Gv of the distributed amplifier 100 in this case is given by an equation in which "7" is substituted for n in the abovementioned Equation (1). Accordingly, the voltage gain Gv is smaller than in the abovementioned case of n=8. On the other hand, since the operating points of the source-grounded transistors 101-2 through 101-8 in which the voltage gain is not zero are all point b, a good output waveform with little variation can be obtained.

Similarly, the voltage gain Gv of the distributed amplifier 100 decreases as the number source potentials VS1 through VS8 that are set at +0.8 volts increases. As a result, the voltage gain Gv of the distributed amplifier 100 as a whole can be adjusted in nine stages, from n=0 to n=8. Furthermore, the waveform of the output signal OUT is always good, regardless of the magnitude of the voltage gain Gv.

Figure 2:
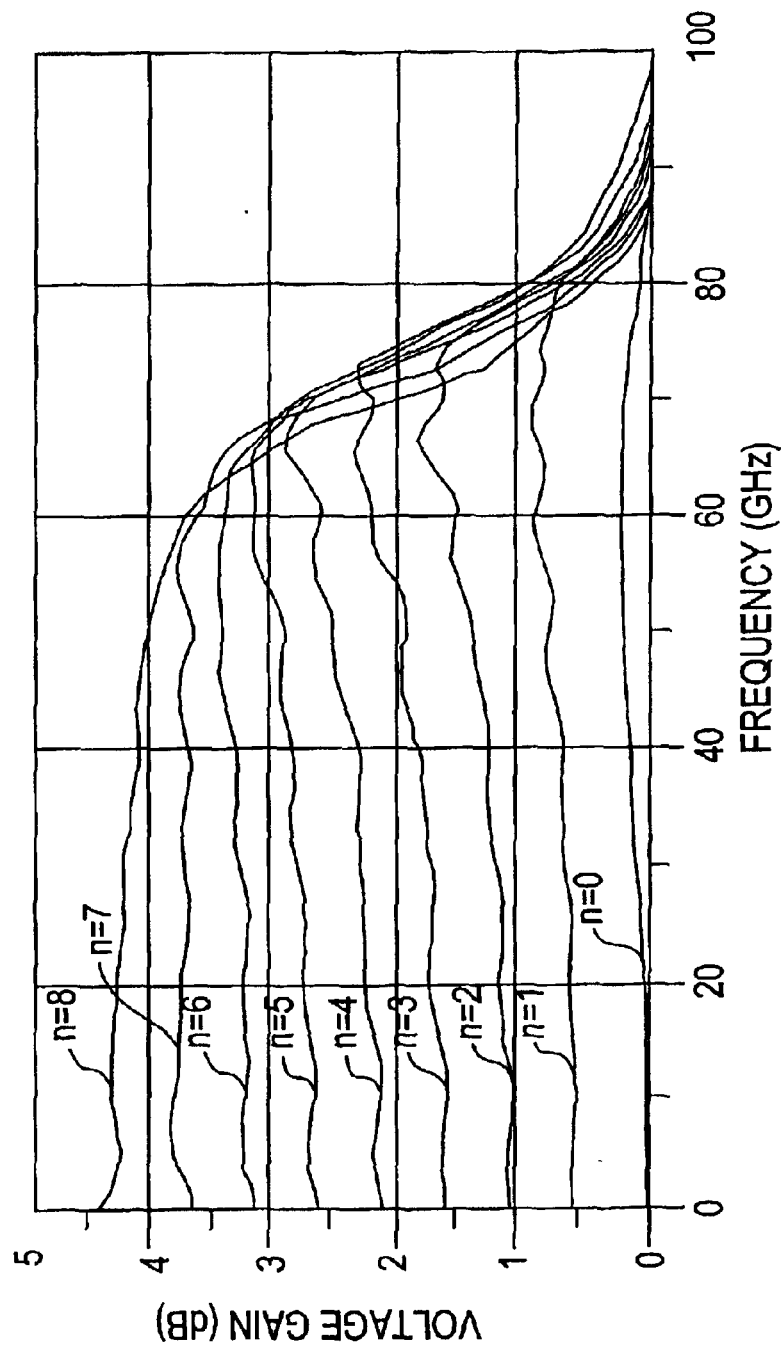
FIG. 2 is a graph which shows the characteristics of the distributed amplifier of the first embodiment.

FIG. 2 is a graph which shows the relationship between the frequency and the voltage gain Gv for each value of n in the abovementioned Equation (1). As is seen from FIG. 2, the voltage gain Gv when n=8 is approximately 12, and the voltage gain Gv decreases as the value of n becomes smaller. Thus, in the distributed amplifier 100 of the present embodiment, the voltage gain Gv can be varied in a favorable manner. Furthermore, the curve indicating the relationship between the frequency and the voltage gain Gv can be sufficiently flattened regardless of the value of n.

Figure 3A:
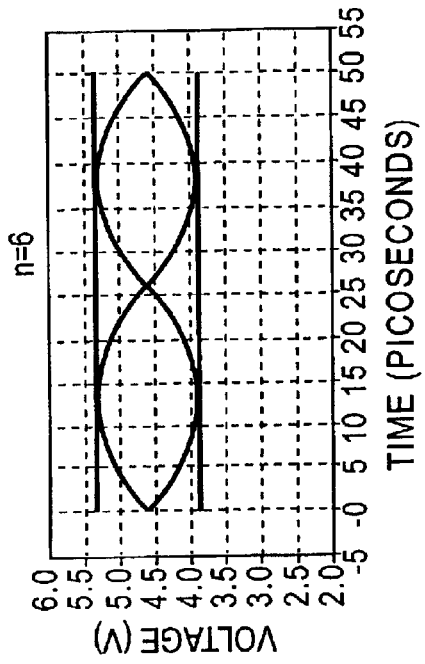
FIGS. 3A, 3B, 3C and 3D are graphs which show the characteristics of the distributed amplifier of the first embodiment.
Figure 3B:
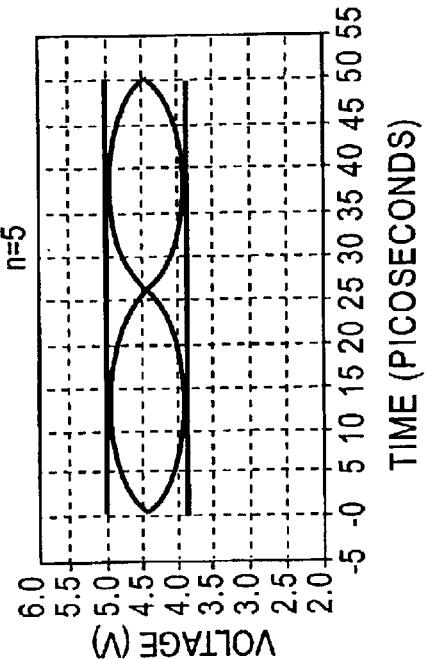
Figure 3C:
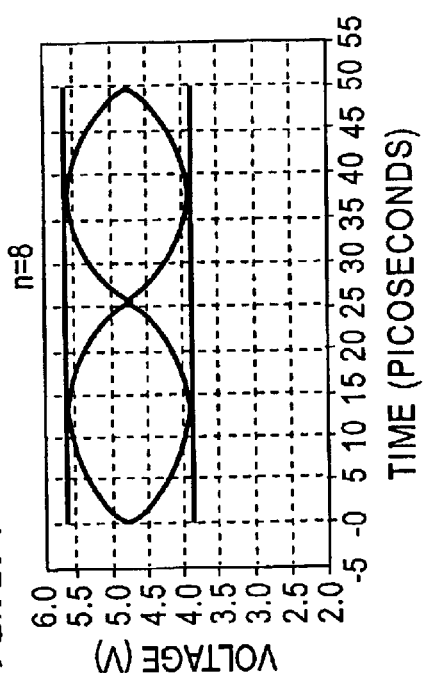
Figure 3D:
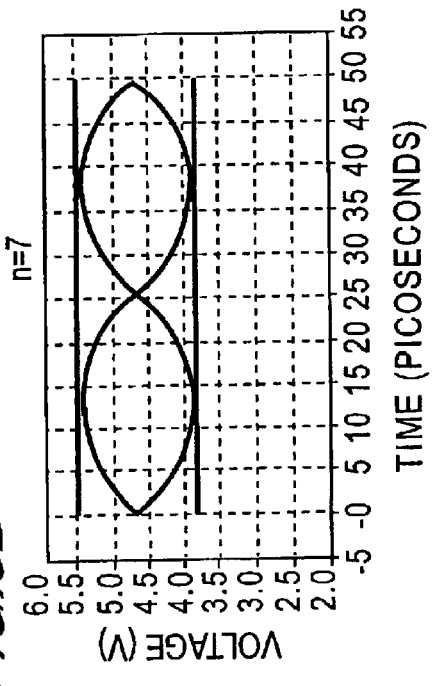
Figure 4C:
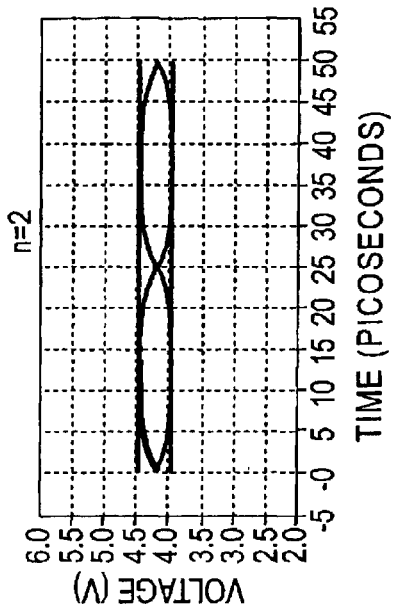
FIGS. 4A, 4B, 4C and 4D are graphs which show the characteristics of the distributed amplifier of the first embodiment.
Figure 4D:
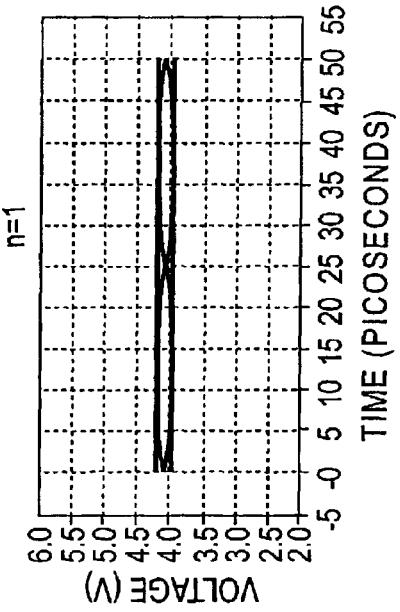
Figure 4A:
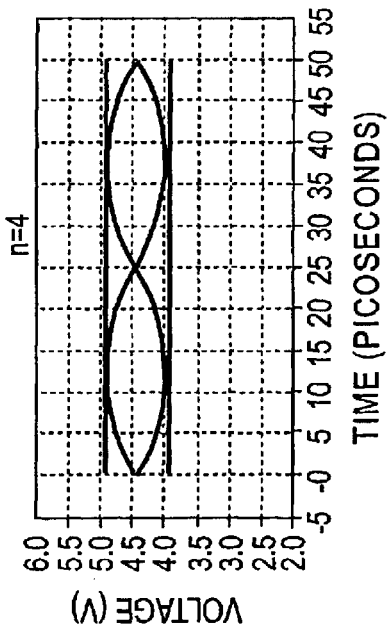
Figure 4B:
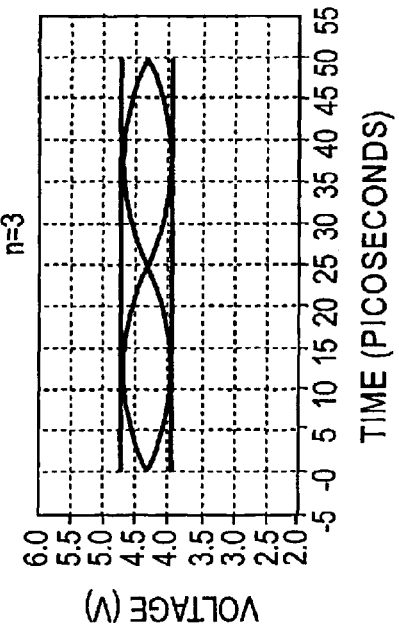

FIGS. 3A through 3D and FIGS. 4A through 4D show the results of a simulation of the output waveform of the distributed amplifier 100. The same eye pattern as that used in the conventional circuit (see FIG. 8A) was used as the waveform of the input signal IN. In a case where n=8 (that is, in a case where the source potentials VS1 through VS8 were all zero volts), as is shown in FIG. 3A, the voltage gain Gv was 4, and the output amplitude was 2.0 Vpp. Furthermore, in a case where n=7, as is shown in FIG. 3B, the voltage gain Gv was 3.5, and the output amplitude was 1.75 Vpp. Similarly, in cases where n was 6 or less as well, a relationship was seen in which the voltage gain Gv decreased by 0.5, and the output amplitude decreased by 0.25 Vpp, when n decreased by "1". As is seen from FIGS. 3 and 4, the deviation of the cross point was substantially zero regardless of the magnitude of n, so that a good output waveform was obtained.

In this embodiment, as was described above, the voltage gain Gv is not controlled by uniformly varying the operating points of the respective source-grounded transistors (see FIG. 9); instead, the voltage gain Gv is controlled by means of the number of source-grounded transistors that contribute to signal amplification. Furthermore, the operating points of the source-grounded transistors contributing to signal amplification were all set at point b. Accordingly, in the present embodiment, an output waveform with little variation, i.e., a good output waveform, can always be obtained regardless of the magnitude of the voltage gain Gv.

Furthermore, in this embodiment, it is necessary merely to set the source potentials VS1 through VS8 of the source-grounded transistors at either zero volts or 0.8 volts; there is no need for fine adjustment of the source potentials VS1 through VS8. Specifically, in the present embodiment, the source potentials VS1 through VS8 can be set using digital signals in which the low level is zero volts and the high level is 0.8 volts, so that the source potential generating circuit maybe constructed very simply. Accordingly, in the present invention, the construction of the external control circuit can be simplified.

However, the distributed amplifier of the present embodiment may also be constructed so that the source potentials VS1 through VS8 are finely adjusted in analog terms instead of being set at either zero volts or 0.8 volts. In this case, detailed formation of the output waveform and fine adjustment of the voltage gain Gv are possible.

Furthermore, in the distributed amplifier 100 of the present embodiment, the source potential was individually set for each source-grounded transistor; however, it would also be possible to divide the source-grounded transistors 101-1 through 101-8 into blocks, and to set the source potential for each block. In this case, the number of source potential input terminals (114-1 through 114-8 in FIG. 1) can be reduced; accordingly, the number of electrodes of the semiconductor chip on which the distributed amplifier 100 is mounted can be reduced.

Furthermore, in the distributed amplifier 100 of the present invention, field effect transistors were used for all of the transistors; however, it would also be possible to use bipolar transistors. In such a case, emitter-grounded transistors are used instead of the source-grounded transistors 101-1 through 101-8, and base-grounded transistors are used instead of the gate-grounded transistors 102-1 through 102-8.

Moreover, in the distributed amplifier 100 of the present embodiment, cascode amplifying circuits were used as the amplifying circuits; however, the present embodiment can also be used in cases where the amplifying circuits of the respective sections are constructed only from source-grounded transistors or only from emitter-grounded transistors.

In the distributed amplifier 100 of the present embodiment, the potentials VS1 through VS8 were applied from source potential input terminals 114-1 through 114-8; however, it would also be possible to install respective switches in place of these source potential input terminals 114-1 through 114-8. In such a case, one end of each switch is connected to one of the source-grounded transistors 101-1 through 101-8, and zero volts is applied from the other end of each switch. Since zero volts is applied to the sources of the source-grounded transistors that correspond to the closed switches, these transistors have a gain. On the other hand, since no source current flows through the source-grounded transistors corresponding to the open switches, these transistors have a gain of zero. Accordingly, a distributed amplifier constructed in this manner can be operated in the same manner as the distributed amplifier 100 of the present embodiment.

As was described above, there may be cases in which it is deliberately desired to shift the cross point from the center between the high level and low level, depending on the application of the distributed amplifier. In such cases, the positions of the operating points of the source-grounded transistors 101-1 through 101-8 may be deliberately set in positions which are such that the mutual conductance gm shows left-right asymmetry (see points c and d in FIG. 9). In the distributed amplifier 100, variation of the position of the operating point with the voltage gain is prevented so that the desired output signal waveform can be obtained in such cases as well.

Second Embodiment

Next, a distributed amplifier constituting a second embodiment of the present invention will be described with reference to FIG. 5.

Among other respects, the distributed amplifier of this embodiment differs from the abovementioned conventional distributed amplifier 700 (see FIG. 7) in that the gate bias of the gate-grounded transistors is not a common bias.

Figure 5:
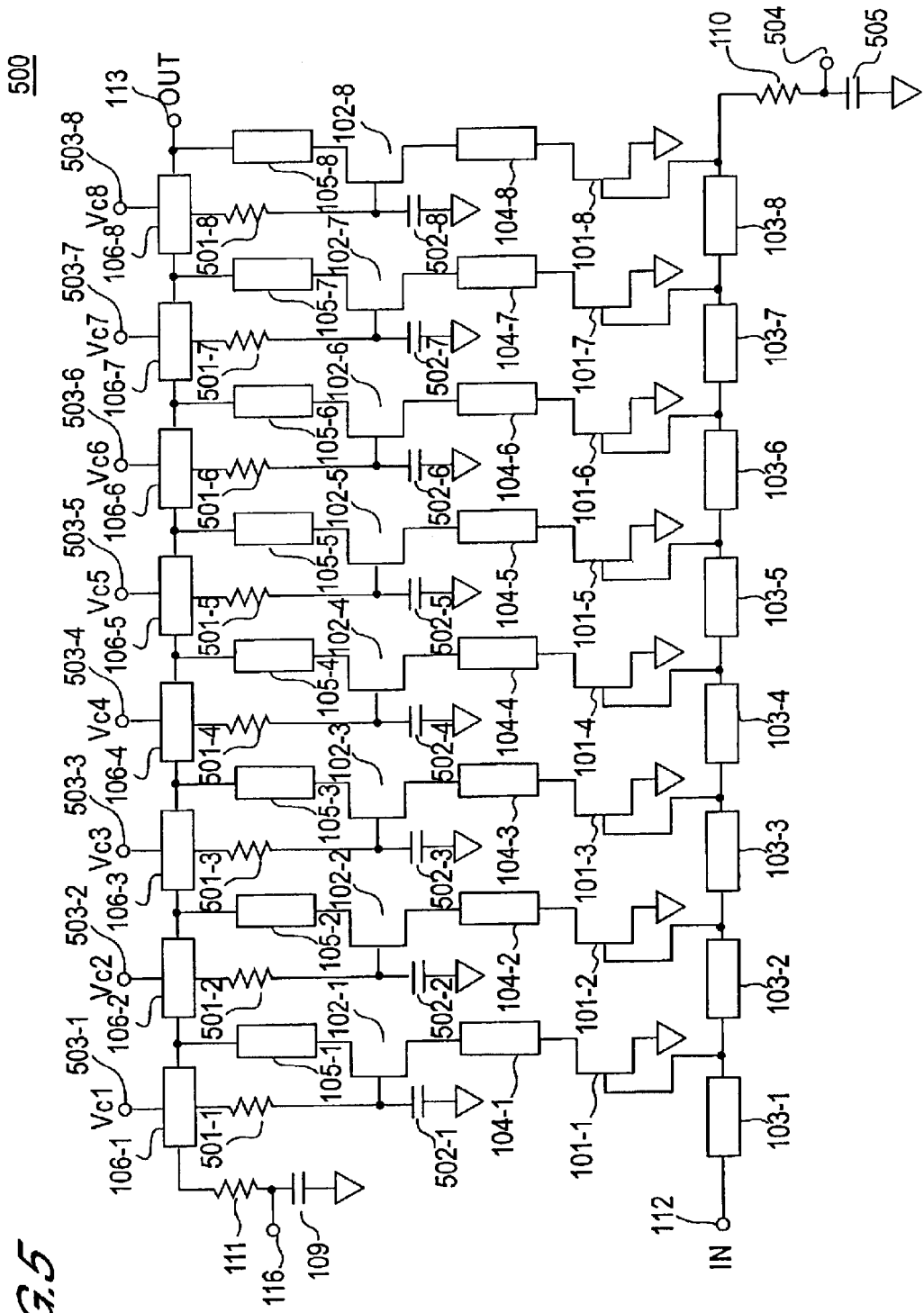
FIG. 5 is a circuit diagram which shows the construction of a distributed amplifier constituting a second embodiment of the present invention.

FIG. 5 is a circuit diagram which shows the construction of the distributed amplifier 500 of this embodiment.

In FIG. 5, constituent elements that are labeled with the same symbols as in FIG. 1 are respectively the same as in the case of FIG. 1.

As is shown in FIG. 5, the distributed amplifier 500 comprises resistances 501-1 through 501-8, capacitors 502-1 through 502-8, bias input terminals 503-1 through 503-8 used for the gate-grounded transistors 102-1 through 102-8, a bias input terminal 504 used for the source-grounded transistors 101-1 through 101-8 and a capacitor 505.

One end of each of the resistances 501-1 through 501-8 is connected to the gate of one of the gate-grounded transistors 102-1 through 102-8, and the other end of each resistance 501-1 through 501-8 is connected to one of the bias input terminals 503-1 through 503-8. The resistances 501-1 through 501-8 are provided in order to protect the gates of the gate-grounded transistors 102-1 through 102-8 from static electricity and the like.

One end of each of the capacitors 502-1 through 502-8 is connected to the gate of one of the gate-grounded transistors 102-1 through 102-8, and the other end of each capacitor 502-1 through 502-8 is connected to the ground line. The capacitors 502-1 through 502-8 are provided in order to stabilize the potential supplied to the gates of the gate-grounded transistors 102-1 through 102-8 from the bias input terminals 503-1 through 503-8.

The bias input terminal 504 is a terminal that is used to adjust the gate bias of the source-grounded transistors 101-1 through 101-8. An external circuit (not shown in the figures) is connected to the bias input terminal 504 in order to cut the direct-current component.

The capacitor 505 is used for alternating-current termination of the input side.

Next, the operation of the distributed amplifier 500 shown in FIG. 5 will be described.

As in the first embodiment, a power supply potential VDD is applied to the signal output terminal 113 of the distributed amplifier 500 by means of a bias circuit not shown in the figures. In this embodiment as well, the power supply potential VDD was set at 4 volts. Furthermore the potential of the bias input terminal 504 was set at zero volts.

Potentials Vc1 through Vc8 are applied to the bias input terminals 503-1 through 503-8 as the gate biases of the gate-grounded transistors 102-1 through 102-8. In this embodiment, the potentials Vc1 through Vc8 are set at either +2 volts or −1 volt. In cases where the bias (potential Vc1 through Vc8) of a gate-grounded transistor is +2 volts, the operating point of this gate-grounded transistor has a curve that shows left-right symmetry as in the case of the operating point b (see FIG. 9) in the source-grounded transistors. On the other hand, in cases where the gate bias of a gate-grounded transistors is −1 volt, the voltage gain of this gate-grounded transistor is zero as in the case of the operating point e (see FIG. 9) in the source-grounded transistors.

Characteristics similar to those of the first embodiment (see FIGS. 2 through 4) can also be obtained using the distributed amplifier 500 of this embodiment.

The voltage gain Gv of the distributed amplifier 500 increases with an increase in the number of the gate biases Vc1 through Vc8 that are set at +2 volts. As a result, the voltage gain Gv of the distributed amplifier 500 can be adjusted in nine stages. Furthermore, as in the case of the first embodiment, the waveform of the output signal OUT is always good regardless of the magnitude of the voltage gain Gv.

In the present embodiment, as was described above, the amplifier is devised so that the voltage gain can be controlled by varying the number of gate-grounded transistors that contribute to signal amplification; furthermore, the operating points of the gate-grounded transistors that contribute to signal amplification are fixed at operating points which are such that there is little variation in the output waveform. Accordingly, in the present embodiment, a good output waveform with little variation can always be obtained regardless of the magnitude of the voltage gain Gv.

Furthermore, in the present embodiment, it is necessary merely to set the gate biases Vc1 through Vc8 of the gate-grounded transistors at either +2 volts or −1 volt; accordingly, the external circuit that sets the gate biases Vc1 through Vc8 can be constructed very simply.

Moreover, in the distributed amplifier 100 of the first embodiment, a current of several milliamperes to several tens of milliamperes flows to the source potential input terminals 114-1 through 114-8, while in the distributed amplifier 500 of the present embodiment, almost no current flows to the bias input terminals 503-1 through 503-8. Accordingly, the design of external circuits is even simpler than in the case of the first embodiment.

However, it would also be possible to construct the distributed amplifier 500 of the present embodiment so that the gate biases Vc1 through Vc8 can be finely adjusted in analog terms instead of being set at either +2 volts or −1 volt. In this case, detailed formation of the output waveform and fine adjustment of the voltage gain Gv are possible.

Furthermore, in the distributed amplifier 500 of the present embodiment, the gate bias was individually set for each gate-grounded transistor; however, it would also be possible to divide the gate-grounded transistors 102-1 through 102-8 into a plurality of blocks, and to set the gate bias for each block. In this case, the number of bias input terminals (503-1 through 503-8 in FIG. 5) can be reduced; accordingly, the number of electrodes on the semiconductor chip on which the distributed amplifier 500 is mounted can be reduced.

Furthermore, in the distributed amplifier 500 of the present embodiment, field effect transistors were used for all of the transistors; however, it would also be possible to use bipolar transistors. In such a case, emitter-grounded transistors are used instead of the source-grounded transistors 101-1 through 101-8, and base-grounded transistors are used instead of the gate-grounded transistors 102-1 through 102-8.

Moreover, in the distributed amplifier 500 of the present embodiment, cascode amplifying circuits were used as the amplifying circuits; however, the present embodiment can also be used in cases where the amplifying circuits of the respective sections are constructed only from gate-grounded transistors or only from base-grounded transistors.

Third Embodiment

Next, a distributed amplifier constituting a third embodiment of the present invention will be described with reference to FIG. 6.

Among other respects, the distributed amplifier of this embodiment differs from the conventional distributed amplifier 700 (see FIG. 7) in that the gate bias of the source-grounded transistors is not a common bias.

Figure 6:
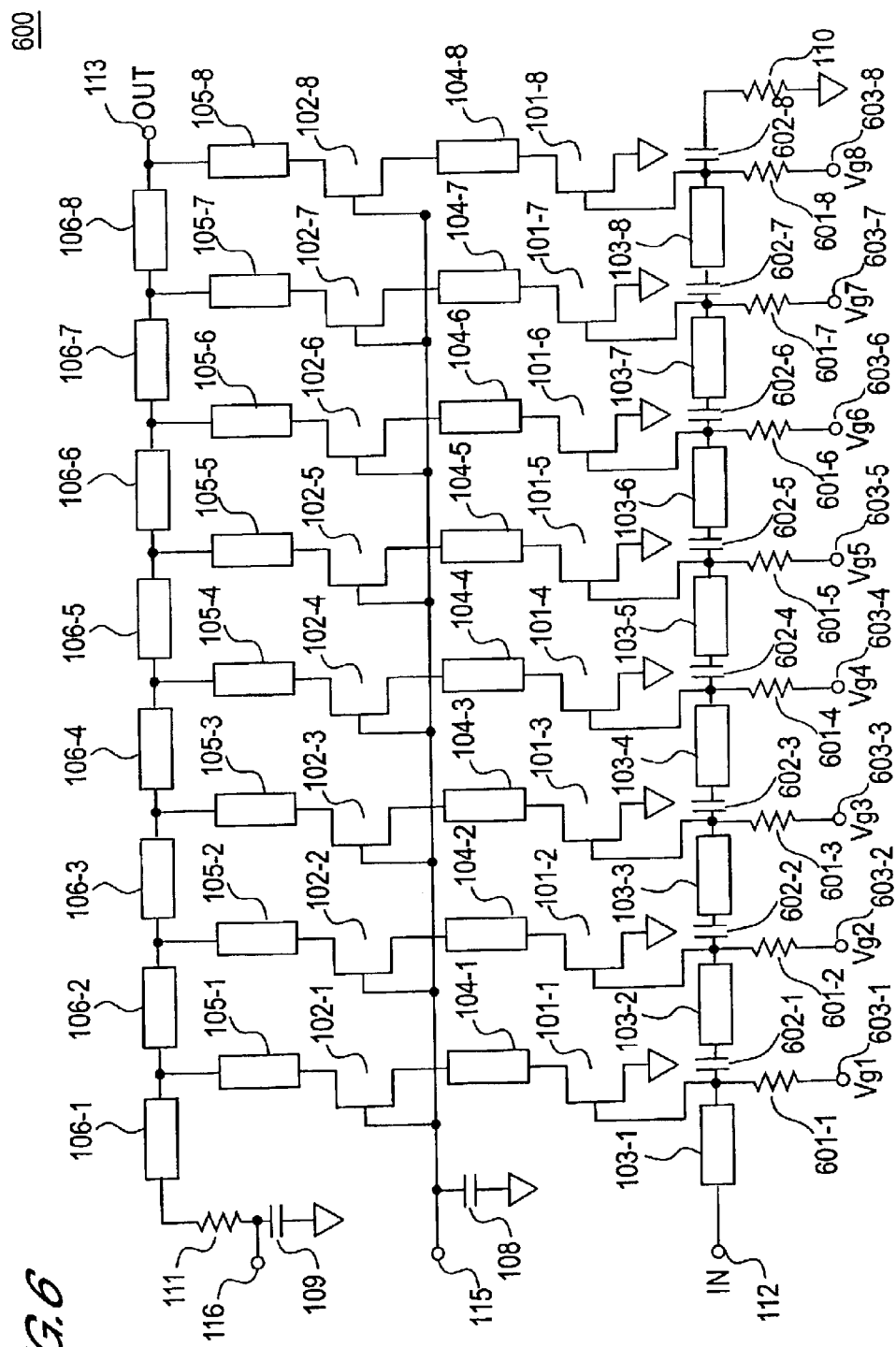
FIG. 6 is a circuit diagram which shows the construction of a distributed amplifier constituting a third embodiment of the present invention.

FIG. 6 is a circuit diagram which shows the construction of the distributed amplifier 600 of the present embodiment.

In FIG. 6, constituent elements that are labeled with the same symbols as in FIG. 1 are respectively the same elements as in FIG. 1.

As is shown in FIG. 6, the distributed amplifier 600 comprises resistances 601-1 through 601-8, capacitors 602-1 through 602-8, and gate bias input terminals 603-1 through 603-8.

One end of each of the resistances 601-1 through 601-8 is connected to one of the connection points between the coplanar transmission lines 103-1 through 103-8 and the gates of the source-grounded transistors 101-1 through 101-8. Furthermore, the other end of each of the resistances 601-1 through 601-8 is connected to one of the gate bias input terminals 603-1 through 603-8. The resistances 601-1 through 601-8 are provided in order to prevent the input signal IN from leaking to the bias input terminals 603-1 through 603-8; for example, resistances of approximately 10 kilo-ohms are used.

The capacitors 602-1 through 602-7 are disposed between the abovementioned connection points and the coplanar transmission lines 103-2 through 103-8 of the next stage. Furthermore, the capacitor 602-8 is disposed between the abovementioned connection points and the terminating resistance 110. The capacitors 602-1 through 602-8 block the direct-current component, and thus make it possible to apply a different gate bias to each of the source-grounded transistors 101-1 through 101-8. The distributed amplifier 600 of the present invention is suitable for use as an amplifier for high-frequency analog signals. In the case of use with high-frequency analog signals, the capacitors 602-1 through 602-8 require only a small capacitance; accordingly, the distributed amplifier 600 can be realized on a small circuit scale.

Next, the operation of the distributed amplifier 600 shown in FIG. 6 will be described.

A power supply potential VDD is applied to the signal output terminal 113 of the distributed amplifier 600 by means of a bias circuit not shown in the figures. In this embodiment, the power supply potential VDD was set at 4 volts. Furthermore, a gate bias potential VC is applied to the gate bias input terminal 115. In this embodiment, the gate bias potential VC was set at 2 volts.

Potentials Vg1 through Vg8 are applied to the bias input terminals 603-1 through 603-8 as the gate biases of the source-grounded transistors 101-1 through 101-8. In this embodiment, the potentials Vg1 through Vg8 are set at either zero volts or –0.8 volts. In cases where the gate bias (potential Vg1 through Vg8) of a source-grounded transistor is zero volts, the operating point of this source-grounded transistor is the point b (see FIG. 9). On the other hand, in cases where the gate bias of a source-grounded transistor is –0.8 volts, the gate-source voltage of this source-grounded transistor is –0.8 volts, so that this source-grounded transistors is pinched off; accordingly, the voltage gain is zero (see FIG. 9).

Characteristics similar to those of the first embodiment (see FIGS. 2 through 4) can also be obtained using the distributed amplifier 600 of the present embodiment.

The voltage gain Gv of the distributed amplifier 600 increases with an increase in the number of gate biases Vg1 through Vg8 that are set at zero volts. As a result, the voltage gain Gv of the distributed amplifier 600 as a whole can be adjusted in nine stages. Furthermore, as in the first embodiment, the waveform of the output signal OUT is always good regardless of the magnitude of the voltage gain Gv.

In the present embodiment, as in the first embodiment (as was described above), the voltage gain Gv is controlled by controlling the number of source-grounded transistors that contribute to signal amplification; furthermore, the operating points of the gate-grounded transistors that contribute to signal amplification are fixed at the point b. Accordingly, in this embodiment, a good output waveform with little variation can always be obtained regardless of the magnitude of the voltage gain Gv.

Furthermore, in this embodiment, it is necessary merely to set the gate biases Vg1 through Vg8 of the source-grounded transistors at either zero volts or –0.8 volts; accordingly, the external circuit that sets the gate biases Vg1 through Vg8 may be constructed very simply.

Moreover, in the case of the distributed amplifier of the first embodiment, a current of several milliamperes to several tens of milliamperes flows to the source potential input terminals 114-1 through 114-8, while in the distributed amplifier 600 of the present embodiment, almost no current flows to the bias input terminals 603-1 through 603-8. Accordingly, the design of external circuits is even simpler than in the case of the first embodiment.

However, it would also be possible to construct the distributed amplifier 600 of the present embodiment so that the gate biases Vg1 through Vg8 can be finely adjusted in analog terms instead of being set at either zero volts or –0.8 volts. In this case, detailed formation of the output waveform and fine adjustment of the voltage gain Gv are possible.

Furthermore, in the distributed amplifier 600 of the present embodiment, the gate biases were individually set for each source-grounded transistor; however, it would also be possible to divide the source-grounded transistors 101-1 through 101-8 into a plurality of blocks, and to set the gate bias for each block. In this case, the number of bias input terminals (603-1 through 603-8 in FIG. 5) can be reduced; accordingly, the number of electrodes on the semiconductor chip on which the distributed amplifier 600 is mounted can be reduced.

Furthermore, in the distributed amplifier 600 of the present embodiment, field effect transistors were used for all of the transistors; however, it would also be possible to use bipolar transistors. In such a case, emitter-grounded transistors are used instead of the source-grounded transistors 101-1 through 101-8, and base-grounded transistors are used instead of the gate-grounded transistors 102-1 through 102-8.

Moreover, in the distributed amplifier 600 of the present embodiment, cascode amplifying circuits were used as the amplifying circuits; however, the present embodiment can also be used in cases where the amplifying circuits of the respective sections are constructed only from source-grounded transistors or only from emitter-grounded transistors.

In the present invention, as was described above, a good output waveform can be obtained by setting the gain for each amplifying circuit or for each block of amplifying circuits.

What is claimed is:

1. A distributed amplifier comprising:

a plurality of amplifying circuits;

an input terminal common to said plurality of amplifying circuits; and an output terminal common to said plurality of amplifying circuits, wherein said amplifying circuits are connected in parallel to said common input terminal and said common output terminal, wherein each of said amplifying circuits is operable to input a signal supplied from said input terminal, to amplify the input signal and to output the signal to said output terminal following amplification, wherein said amplifying circuits are constructed so that gain values can be set separately for each of said amplifying circuits, wherein said amplifying circuits comprise cascode amplifying circuits, wherein each of said amplifying circuits comprises a first transistor having a first grounded terminal, a second terminal and a control terminal connected to said input terminal, and a second transistor having a first terminal connected to said second terminal of said first transistor, a second terminal connected to said output terminal and a grounded control terminal, and wherein the gain values of said amplifying circuits are settable via potential application to said first terminal of each of said first transistors.

2. The distributed amplifier according to claim 1, further comprising a plurality of capacitors wherein said first terminal of each of said first transistors is grounded via a corresponding one of said plurality of capacitors.

3. The distributed amplifier according to claim 2, wherein said amplifying circuits are formed on a semiconductor chip, and wherein said capacitors are provided outside of the semiconductor chip on which said amplifying circuits are formed.

4. The distributed amplifier according to claim 1, further comprising:

a capacitor, wherein said control terminals of said second transistors are grounded via said capacitor.

5. The distributed amplifier according to claim 1, wherein the gain values of said amplifying circuits are settable via the bias potentials of said control terminals of said second transistors.

6. The distributed amplifier according to claim 5, further comprising:

a plurality of resistance elements, wherein the bias potentials are applied to the control terminals of said second transistors via a corresponding one of said plurality of resistance elements.

7. The distributed amplifier according to claim 5, further comprising:

a plurality of capacitors, wherein said control terminals of said second transistors are respectively grounded via a corresponding one of said plurality of capacitor.

8. The distributed amplifier according to claim 1, wherein the gain values of said amplifying circuits are settable via bias potentials of said control terminals of said first transistors.

9. The distributed amplifier according to claim 8, further comprising:

a plurality of resistance elements, wherein the bias potentials are applied to the control terminals of said second transistors via a corresponding one of said plurality of resistance elements.

10. The distributed amplifier according to claim 8, further comprising:

a plurality of capacitors, arranged to block direct-current potential between said control terminal of each first transistor and said control terminal of said first transistor of a following stage.

11. The distributed amplifier according to claim 8, further comprising:

a capacitor, wherein said control terminals of said second transistors are grounded via said capacitor.

12. The distributed amplifier according to claim 1, wherein said amplifying circuits are constructed so that the gain of said distributed amplifier can be set at substantially zero, and so that an operating point can be set at a position where an input signal potential-gain curve is substantially symmetrical.

13. The distributed amplifier according to claim 1, wherein said first transistors and said second transistors comprise field effect transistors.

14. The distributed amplifier according to claim 1, wherein said first transistors and second transistors comprise bipolar transistors.

15. The distributed amplifier according to claim 1, further comprising a coplanar transmission line, one end of which is connected to the input terminal, and the other end of which is grounded via a terminating resistance.

16. The distributed amplifier according to claim 1, further comprising a coplanar transmission line, one end of which is connected to the output terminal, and the other end of which is grounded via a terminating resistance.

17. The distributed amplifier according to claim 16, wherein said coplanar transmission line is also grounded via a capacitor.

* * * * *